(12) United States Patent
Eastty et al.

(10) Patent No.: US 6,295,014 B1
(45) Date of Patent: Sep. 25, 2001

(54) SYSTEM FOR PROCESSING ONE-BIT AUDIO SIGNALS

(75) Inventors: Peter Charles Eastty, Eynsham; Peter Damien Thorpe, Botley; Christopher Sleight, Chipping Norton, all of (GB)

(73) Assignee: Sony United Kingdom Limited, Weybridge (GB)

( * ) Notice: Subject to any disclaimer, the term of this patent is extended or adjusted under 35 U.S.C. 154(b) by 0 days.

(21) Appl. No.: 09/177,945

(22) Filed: Oct. 23, 1998

(30) Foreign Application Priority Data

Oct. 24, 1997 (GB) .................................................. 9722533

(51) Int. Cl.$^7$ .................................................. H03M 3/00
(52) U.S. Cl. .................................................. 341/143; 341/144
(58) Field of Search .................................................. 341/143, 144, 341/154

(56) References Cited

U.S. PATENT DOCUMENTS

| | | | | |
|---|---|---|---|---|
| 3,696,298 | * | 10/1972 | Kahn et al. ............................ | 325/59 |
| 4,614,935 | * | 9/1986 | Fling .................................... | 340/347 |
| 5,212,481 | | 5/1993 | Ichihara ................................ | 341/75 |
| 5,524,089 | | 6/1996 | Takano ................................ | 364/748.5 |
| 5,652,584 | | 7/1997 | Yoon .................................... | 341/89 |
| 5,701,124 | * | 12/1997 | Ichimura et al. ..................... | 341/50 |
| 5,835,043 | * | 11/1998 | Tsuchida et al. .................... | 341/143 |
| 5,835,044 | * | 11/1998 | Nishino ............................... | 341/143 |
| 5,862,069 | * | 1/1999 | Nestler ............................ | 364/754.01 |
| 5,890,126 | * | 3/1999 | Lindemann .......................... | 704/503 |
| 5,940,019 | * | 8/1999 | Maejima ............................. | 341/143 |
| 5,948,052 | * | 9/1999 | Toler .................................. | 708/517 |

FOREIGN PATENT DOCUMENTS

| | | | |
|---|---|---|---|
| 681380 A1 | * | 4/1995 | (EP) .............................. H04K/1/04 |
| 2 149 162 A | | 6/1985 | (GB) . |
| 2 162 977 A | | 2/1986 | (GB) . |
| 2 187 013 A | | 8/1987 | (GB) . |

* cited by examiner

Primary Examiner—Peguy JeanPierre
(74) Attorney, Agent, or Firm—Frommer Lawrence & Haug LLP; William S. Frommer; Bruno Polito

(57) ABSTRACT

An audio signal processor for processing 1-bit signals, comprises an input 40 for receiving a 1-bit signal, means 41, 42 for applying a predetermined filter characteristic to the 1-bit signal whereby the signal is also converted to an n-bit signal where n is greater than one, means 43 for determining the absolute value of the n-bit signal, means 46, 51 for producing a dynamics control signal dependent on the said absolute value, means 48 for applying the dynamics control signal to the 1-bit input signal, and means 49 for requantizing the dynamics controlled signal as a 1-bit signal and shaping the noise in the requantised 1-bit signal. Circuits for producing LOG base 2 and the corresponding anti-log are also disclosed.

8 Claims, 13 Drawing Sheets

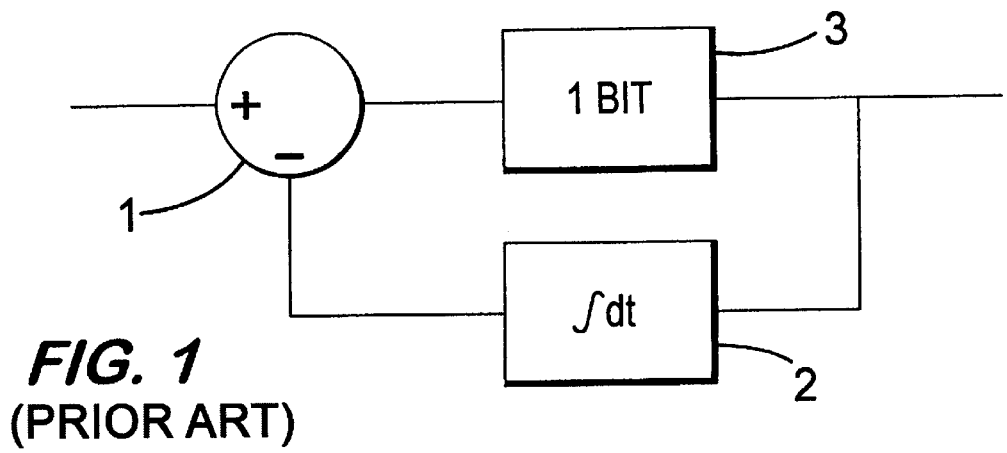
FIG. 1
(PRIOR ART)
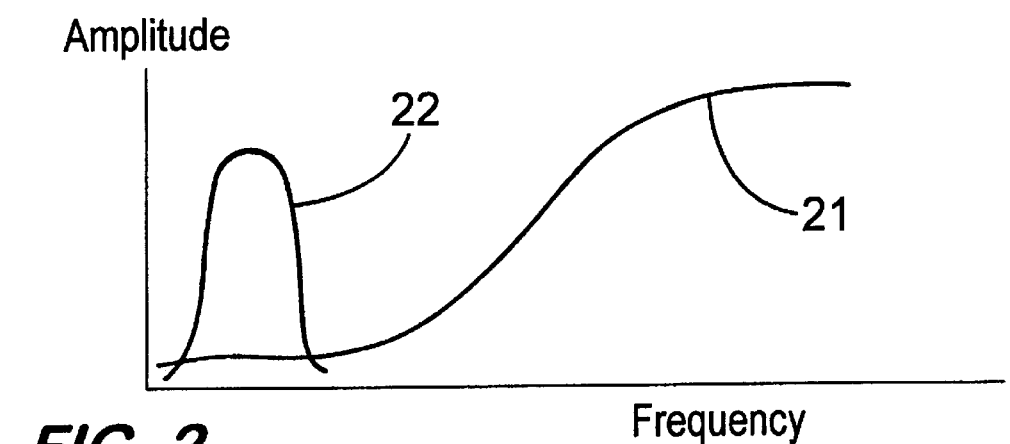
FIG. 2
(PRIOR ART)
FIG. 3
(RELATED ART)
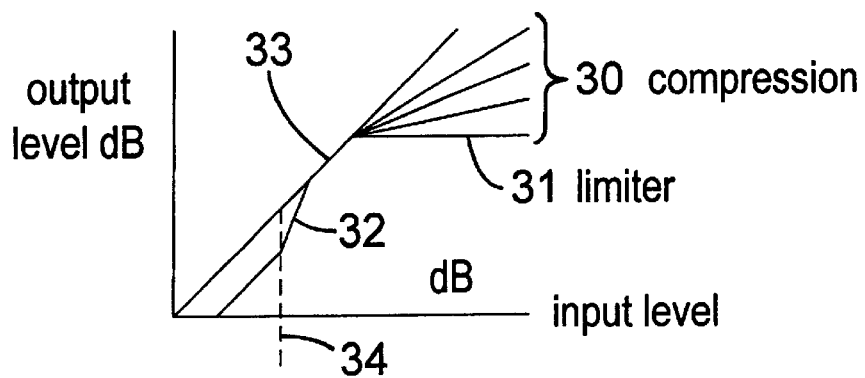

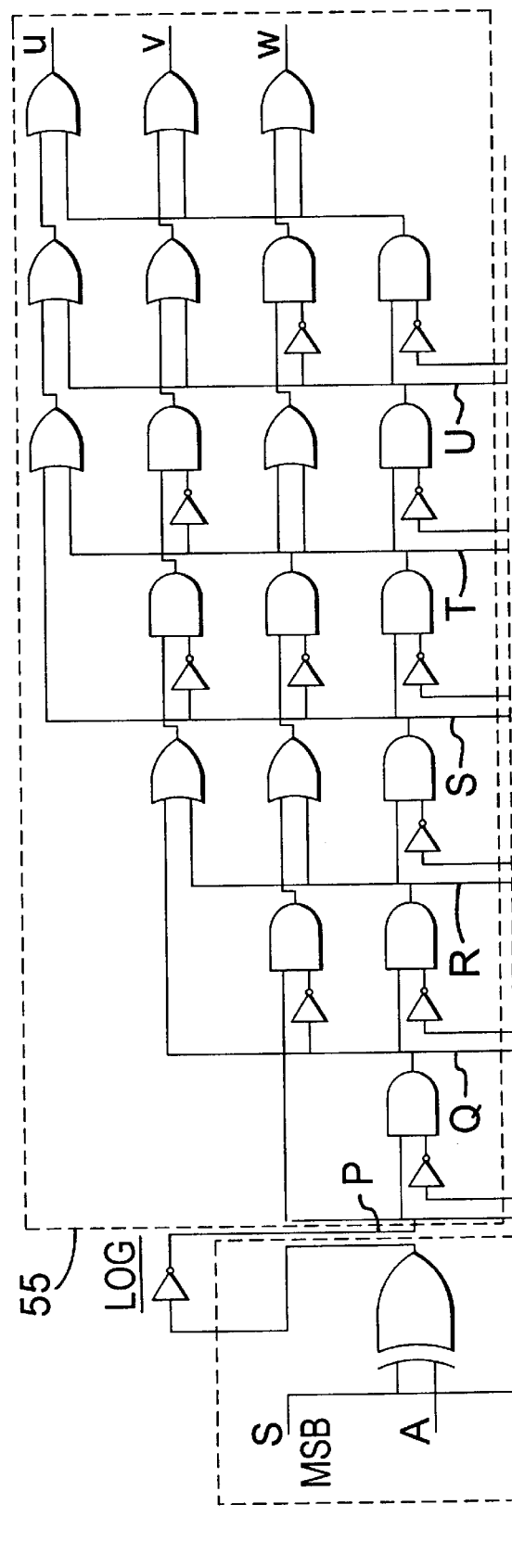
FIG. 5A1

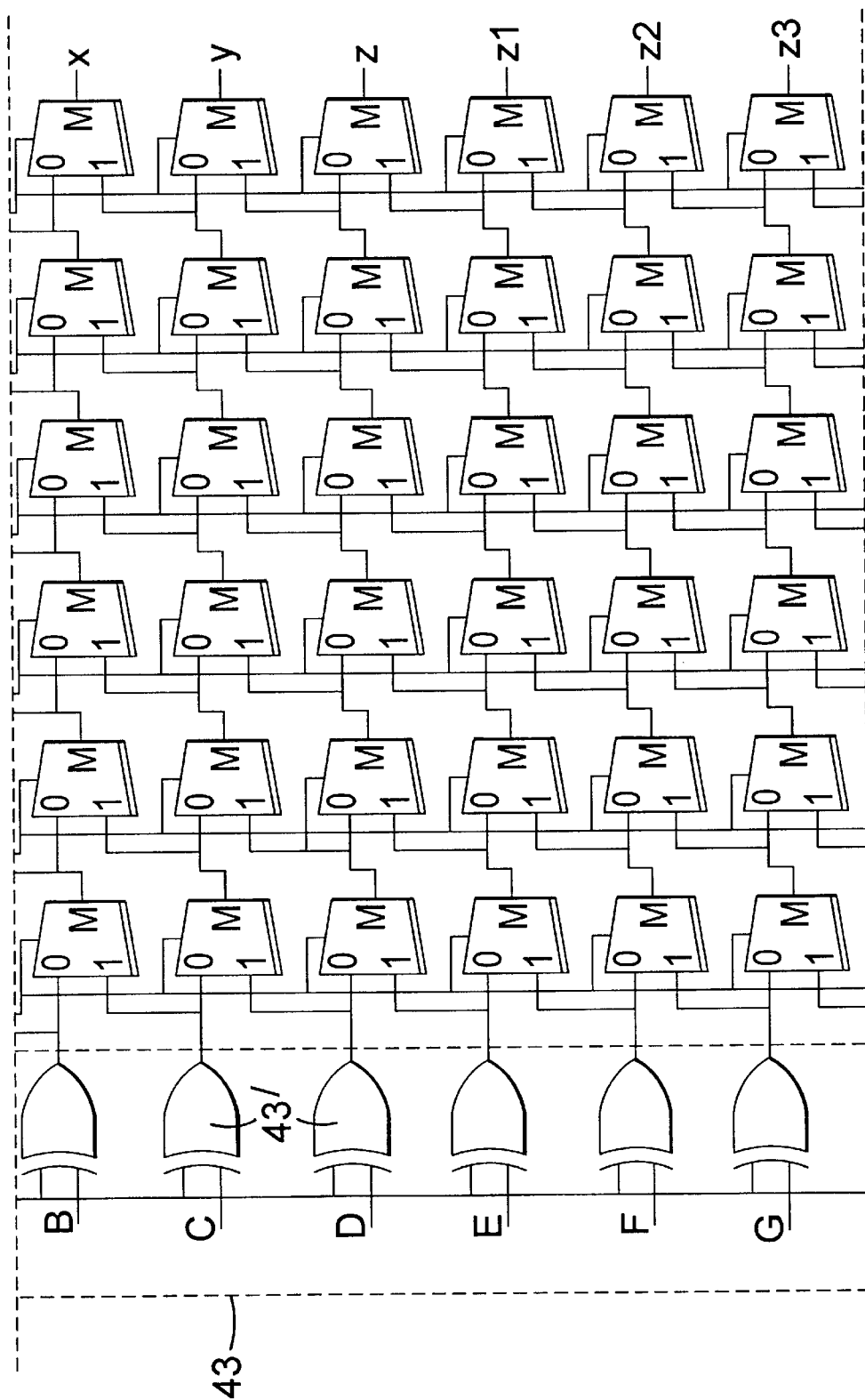
FIG. 5A2

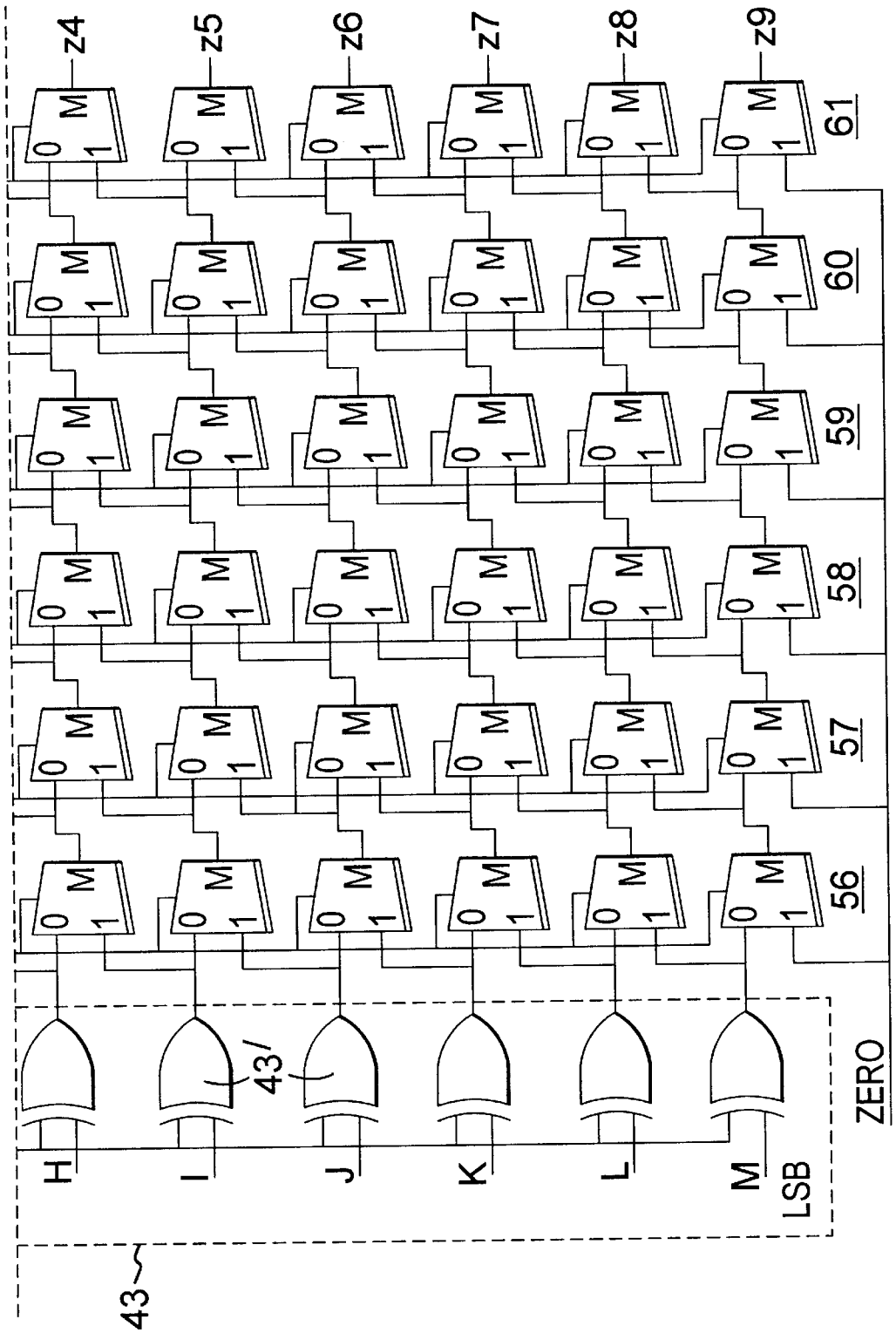
FIG. 5A3

FIG. 9

SYSTEM FOR PROCESSING ONE-BIT AUDIO SIGNALS

BACKGROUND OF THE INVENTION

1. Field of the Invention

The present invention relates to an audio signal processor. Embodiments of the invention are concerned with the control of the dynamics of 1-bit audio signals.

2. Description of the Prior Art

It is known to convert an analogue signal to a digital form by sampling the analogue signal at at least the Nyquist rate and encoding the amplitudes of the samples by an m bit number. Thus if m=8, the sample is said to be quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference 1 (Delta) between an analogue input signal and the integral 2 (Sigma) of the 1-bit output signal is fed to a 1-bit quantizer 3. The output signal comprises bits of logical value 0 and 1 but representing actual values of −1 and +1 respectively. The integrator 3 accumulates the 1-bit outputs so that value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

It is also known that when an audio signal is quantized to 1-bit the audio information is obscured by the quantization noise to an unacceptable extent and it is imperative that the quantisation noise is suitably shaped. Noise shaping is shown diagrammatically in FIG. 2 where 21 denotes the noise shaping and 22 denotes the audio signal.

It is also known to control the dynamics of an audio signal. Control of dynamics includes the control of the dynamic range of the signal by:

a) limitation of the dynamic range
b) dynamic signal compression and
c) dynamic signal expansion.

Compression and expansion involve multiplying the signal by a gain factor dependent on the signal magnitude.

The present invention seeks to apply dynamics control to 1-bit audio signals.

SUMMARY OF THE INVENTION

According to one aspect of the present invention there is provided an audio signal processor for processing 1-bit signals, comprising:

an input for receiving a 1-bit signal, means for applying a predetermined filter characteristic to the 1-bit signal whereby the signal is also converted to a p-bit signal where p is greater than one, means for determining the absolute value of the p-bit signal, means for producing a dynamics control signal dependent on the said absolute value, means for applying the dynamics control signal to the 1-bit input signal, and a Delta Sigma Modulator means for requantizing the dynamics controlled signal as a 1-bit signal and shaping the noise in the requantised 1-bit signal.

Thus the present invention provides dynamic control of a 1-bit signal.

In an embodiment of the invention, the producing means comprises means for forming the log base 2 of the p-bit signal, means for multiplying the log of the p-bit signal by a compression or expansion ratio and means for forming the anti-log thereof to produce the dynamics control signal.

According to another aspect of the present invention, there is provided a circuit a circuit for converting n-bit digital signal values to log base 2 values, comprising n inputs for receiving respective bits of the n-bit signal, shifting means for selectively shifting the bits of the n-bit signal towards the Most Significant Bit (MSB) position, and shift control means for shifting the bits of the n -bit signal a number of shifts towards the MSB until the most significant logic 1 bit reaches the MSB position and for producing a digital value representing the said number of shifts, the log base 2 value being represented by the said digital value representing the said number of shifts and the shifted bits output by the shifting means.

According to a further aspect of the invention, there is provided an anti-log circuit comprising:

n inputs for receiving the respective bits of the log base 2 values, shifting means for selectively shifting the bits towards the Least Significant Bit Position, and shift control means arranged to receive the said digital value representing the number of shifts, and operable to control the shifting means to shift the n-bits towards the LSB by the said number of shifts.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 1 is a simplified block diagram of a 1-bit analogue to digital converter;

FIG. 2 illustrates noise shaping of a 1-bit signal;

FIG. 3 illustrates transfer functions of various dynamic controls applied to an audio signal;

FIG. 5A is a block diagram of a circuit for forming the log base 2 of a p-bit signal according to one aspect of the present invention and FIG. 5B illustrates the transfer function of the circuit of FIG. 5A;

FIG. 9 shows tables useful for describing the invention.

The circuits described herein are digital, clocked, circuits. The clocking arrangements are well known in the art and for convenience are not described.

DESCRIPTION OF THE PREFERRED EMBODIMENTS

Referring to FIG. 3, the control of the dynamics of an audio signal is shown graphically in the logarithmic domain. Line 33 indicates the transfer function of a signal for which the input value x equals the output value y: i.e. it is not subject to dynamics control. In compression and expansion of the input signal, the slope of the transfer function is changed. In compression the slope dy/dx is reduced as indicated at 30. In expansion the slope is increased as indicated at 32. In limiting 31 the value of the output signal is not allowed to increase beyond a set value. In addition it is known to suppress input signal values less than a set threshold as indicated at 34: a process known as "coring".

As well known, compression and expansion is made dependent on the absolute amplitude of the input signal: i.e. the change in slope is dependent on input signal amplitude or signal envelope. Change in the slope of the transfer function corresponds to change in the gain of e.g. an amplifier which amplifies the input signal. In the digital domain that corresponds to multiplying the value of the digital signal by a coefficient representing the desired change of gain.

Figure 4:
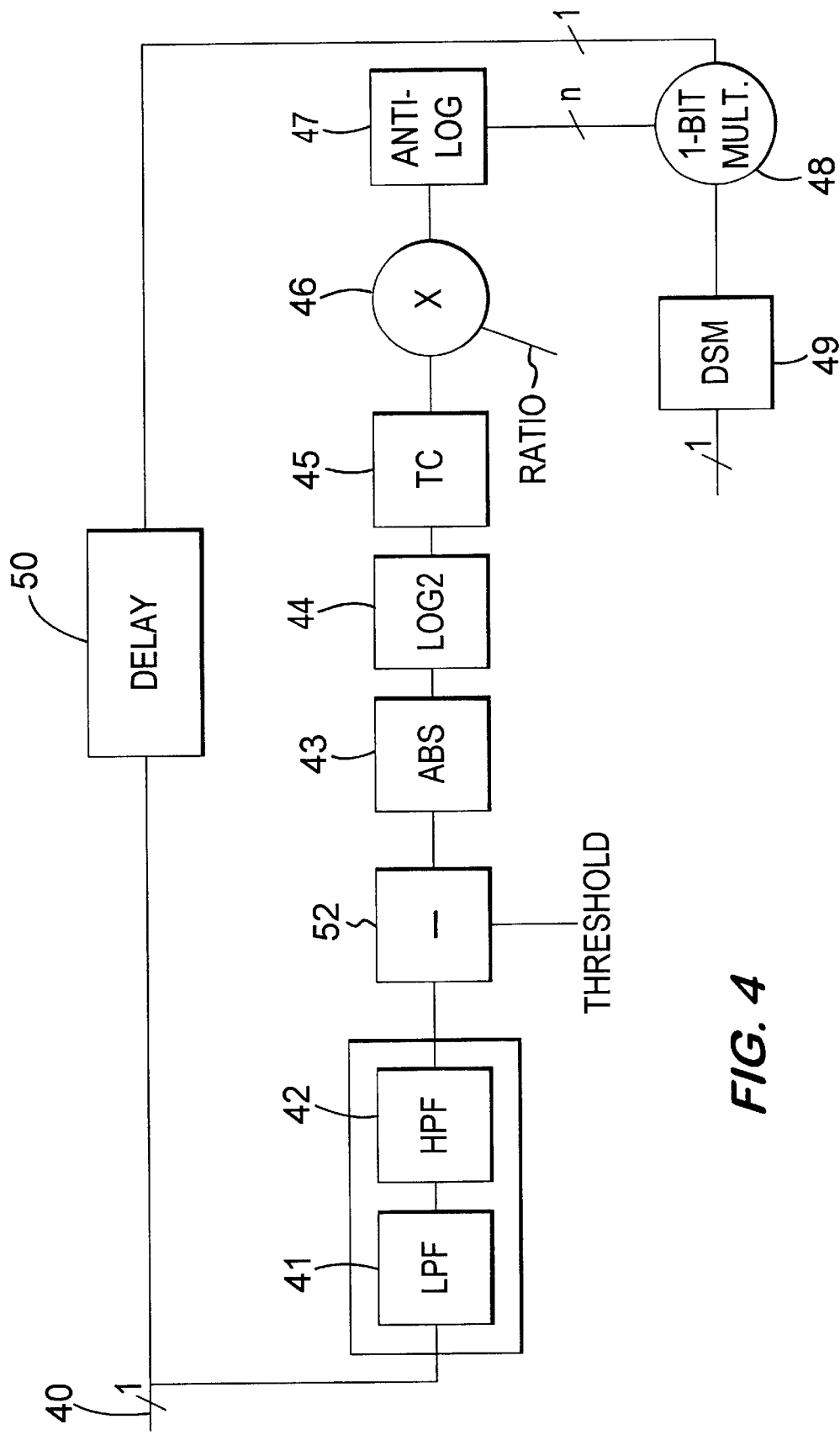
FIG. 4 is a block diagram of a circuit for the dynamics control of a 1-bit signal according to an embodiment of the invention.

Referring to FIG. 4 an illustrative embodiment of the invention is shown. FIG. 4 illustrates only a compressor by way of example. Preferred embodiments of the invention may also include an expander, and/or a limiter and/or a corer.

The compressor comprises an input 40 at which a 1-bit audio signal is received. The 1-bit signal is applied to an envelope detector 41,42,43 which detects the envelope of the 1-bit signal. In FIG. 4 the detector comprises: a bandpass filter comprising a low pass filter 41 and a high pass filter 42; and an absolute value circuit 43. The low and high pass filters may be arranged in the order shown or in the reverse order. The low pass filter primarily detects the envelope of the analogue audio represented by the 1-bit signal. The low pass filter also converts the 1-bit signal to n-bit form the n-bit signal being represented by signed sample values. The high pass filter 42 removes low frequency noise. The absolute value circuit converts the signed values to absolute values. (This corresponds in the analogue domain to rectifying the audio signal.) Thus the output of the envelope detector is an n-bit absolute value signal where n is greater than one e.g. 13 bits. The sampling rate of the n-bit signal is equal to the sampling rate of the 1-bit signal (e.g. 2.8224 MHz) to ensure accurate estimation of peaks of the audio signal.

A circuit 44 converts the n-bit signal to log base two. A time constant circuit 45 is provided to provide a fast attack and a slow decay in response to changes in audio signal absolute amplitude. An n-bit multiplier 46 multiplies the value of the envelope of the audio signal by a ratio which is dependent on the desired compression of the audio signal. The product is then subject to an anti-log operation in an anti-log circuit 47 to produce a compression control signal which is applied to the original 1-bit signal in a 1-bit multiplier 48. The 1-bit signal is supplied to the multiplier via a delay 50. The delay has a delay value corresponding to the processing delay through circuits 41 to 47. The bits of the 1-bit signal represent +1 and −1. The 1-bit multiplier thus either negates (1-bit signal=−1) or passes (1-bit signal=+1) the n-bit signal. The resulting n-bit product is then converted to 1-bit form in a Delta Sigma Modulator 49 which also shapes the quantisation noise as shown in FIG. 2.

As shown in FIG. 3, compression is preferably performed only over a predetermined range of input signal amplitudes above a threshold value. For defining that range, a subtracter 52 is provided between the filters 41,42 and the absolute value circuit 43. An adjustable threshold Th is subtracted from the n-bit audio signal. Any resulting negative signal values are eliminated by the absolute value circuit 43. Because the delay 50 synchronises the 1-bit signal with the compression control signal at the 1-bit multiplier 48, the compression is effected only on that part of the 1-bit signal having an absolute amplitude greater than the threshold.

A signal expander is similar to the compressor of FIG. 4, differing only in the ratio signal applied to the multiplier 46.

A limiter or a corer is easily provided in a digital system by simply and appropriately making the most significant bits zero (limiter) or by making the least significant bits zero (corer).

Figure 5B:
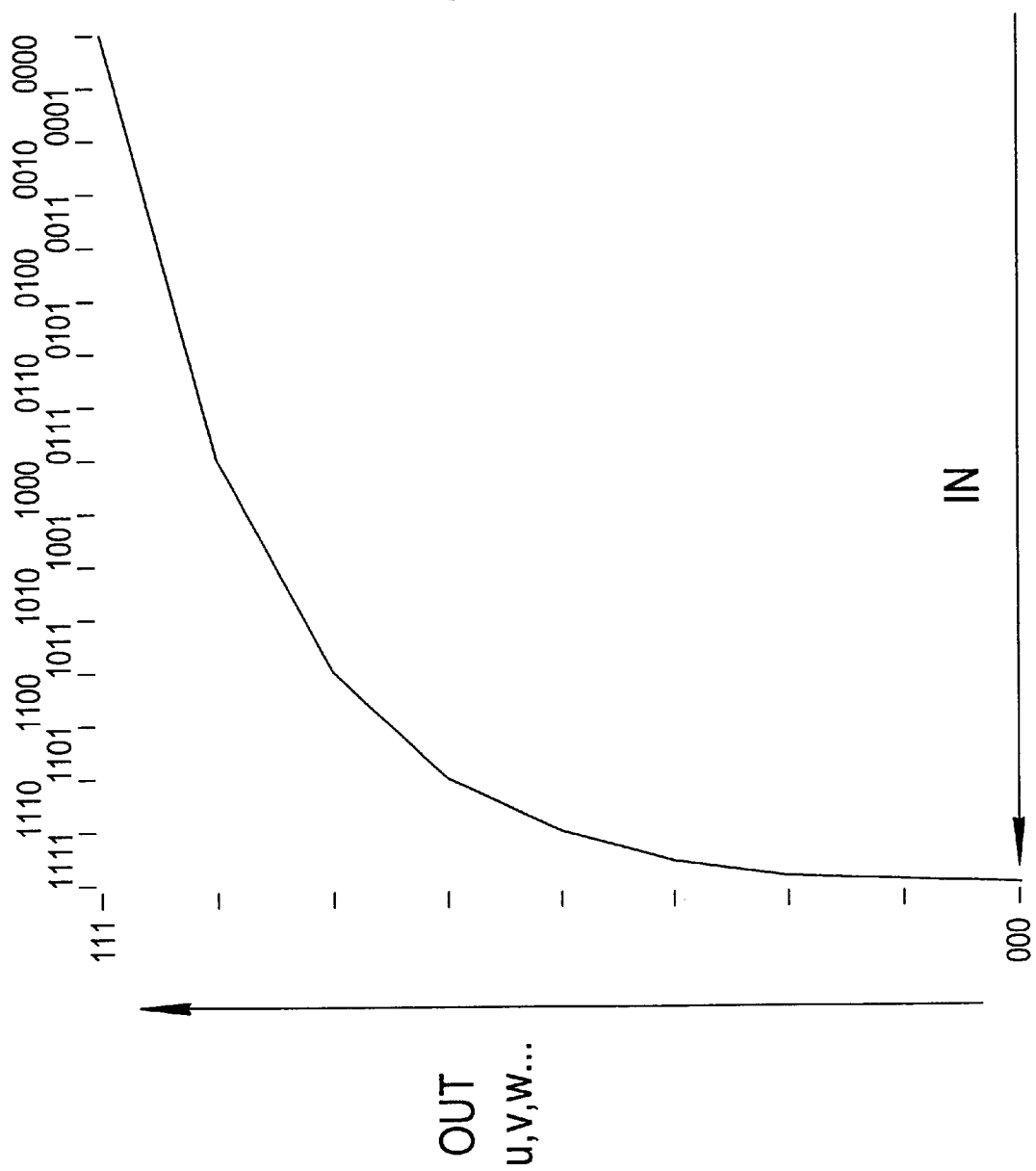

Referring to FIG. 5A an example of the LOG circuit 44 is shown. The circuit does not produce an exact LOG base 2 of the input signal but instead produces a piece-wise linear approximation to LOG base 2 as shown in the graph of FIG. 5B.

The LOG circuit receives n=13 bits A to M of the n-bit audio signal from the absolute value circuit 43 which comprises for example 13 Exclusive-OR gates 43' which EX-OR the n bits with the sign bit S. The n-bits A to M are supplied in parallel to respective inputs of a series of shift circuits 56 to 61 which selectively shift the bits under the control of a shift control circuit 55. The shift control circuit 55 also produces the MSBs of the LOG base 2. In the shown example the shifters comprise multiplexers but they could be shift registers.

In FIG. 5A the inputs of the shift control 55 are labelled P, Q, R, S, T and U. If the shift control signal on an input is logic 1 the shifter shifts one place towards the Most Significant Bit (MSB) (i.e. the top of the shifter). If the shift control signal is logic 0 there is no shift. The shift control causes the bits in the successive shifters to shift one place towards the MSB in each shifter until a logic 1 bit appears at the output of one of the MSB stages (i.e. the top-most stages) of the shifters. The shift in any shifter downstream of that one is disabled. The shift control circuit decodes the position of that one of the shifters in the series thereof to produce the three MSBs (u, v, w) of the LOG approximation.

Referring in more detail to FIG. 5A, each stage of a shifter comprises a multiplexer having one input (denoted 0) connected to receive a bit and another input (denoted 1) connected to the next less significant bit and a shift control input. If the shift control is logic 0 the bit on the 0 input is directed to the output M. If the control input is 1 the next less significant bit is directed to the output M thus shifting it one place towards the MSB. The least significant bit M is provided to the 0 input of the lower-most multiplexer of shifter 56. The 1 input of each lower-most multiplexer receives zero from an input denoted zero.

Figure 9:
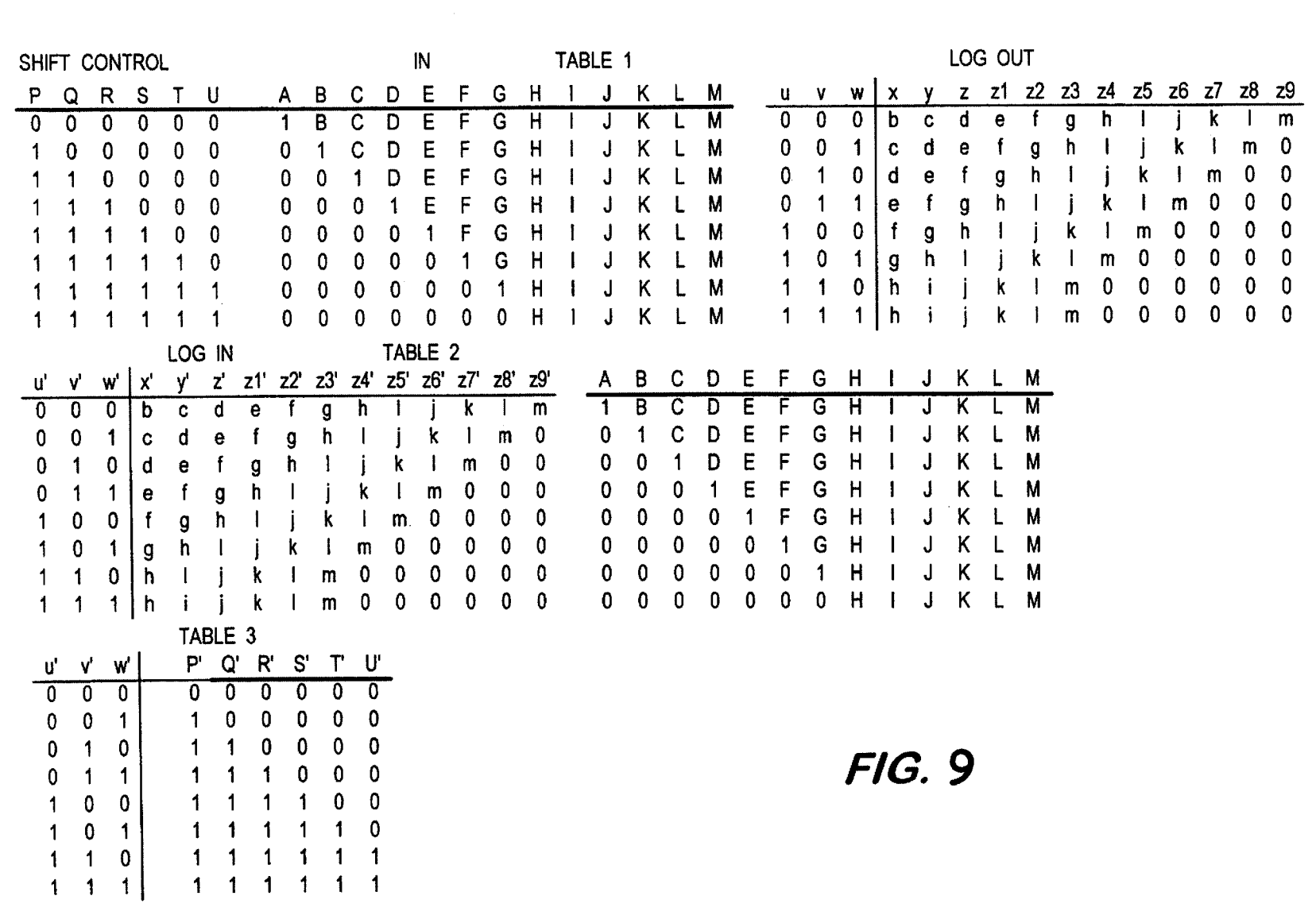

The shift control circuit implements the truth tables set out in Table 1 shown in FIG. 9 annexed hereto. The tables assume the sign bit is zero. Table 1 "SHIFT CONTROL" sets out the values of the shift control signals P to U for each of the values of the input bits A to M given in Table 1 "IN". It will be seen that the values of P to U relate to the position in the input bits A to M of the MSB of value 1. If all of P to U are 0 then no shifts occur in the shifters. If P=1 and all the other Q to U are 0 then one shift occurs in the shifter 56.

If P=1 and Q=1 then a one place shift occurs in each of shifters 56 and 57 and so on.

The effect on the output is shown in "LOG OUT" of Table 1 where the columns are labelled with the outputs u,v, w of the shift control and the outputs x,y,z and z1 to z9 of the final shifter 61.

Figure 6A:
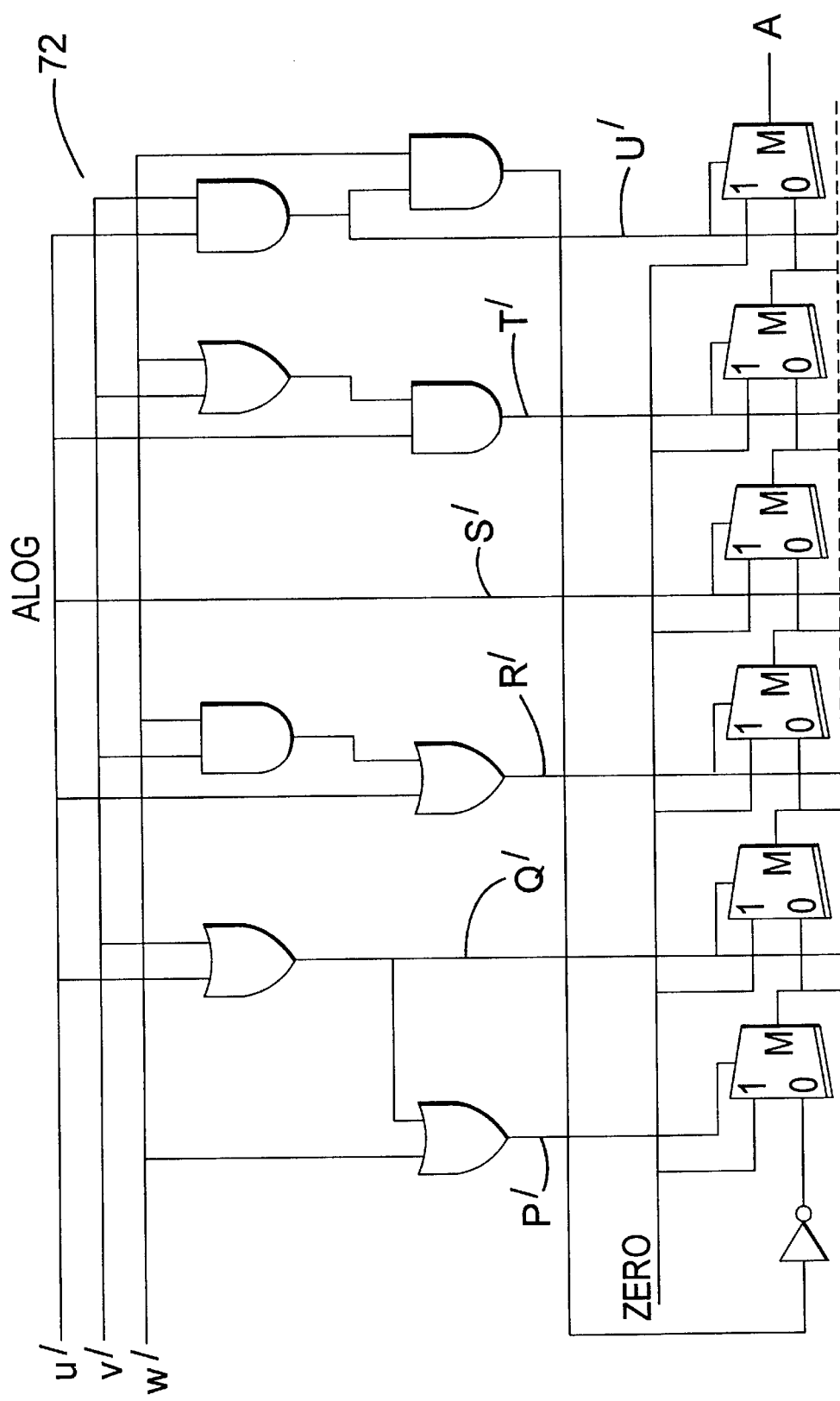
FIG. 6 is a block diagram of an anti-log circuit corresponding to the log circuit of FIG. 5.
Figure 6B:
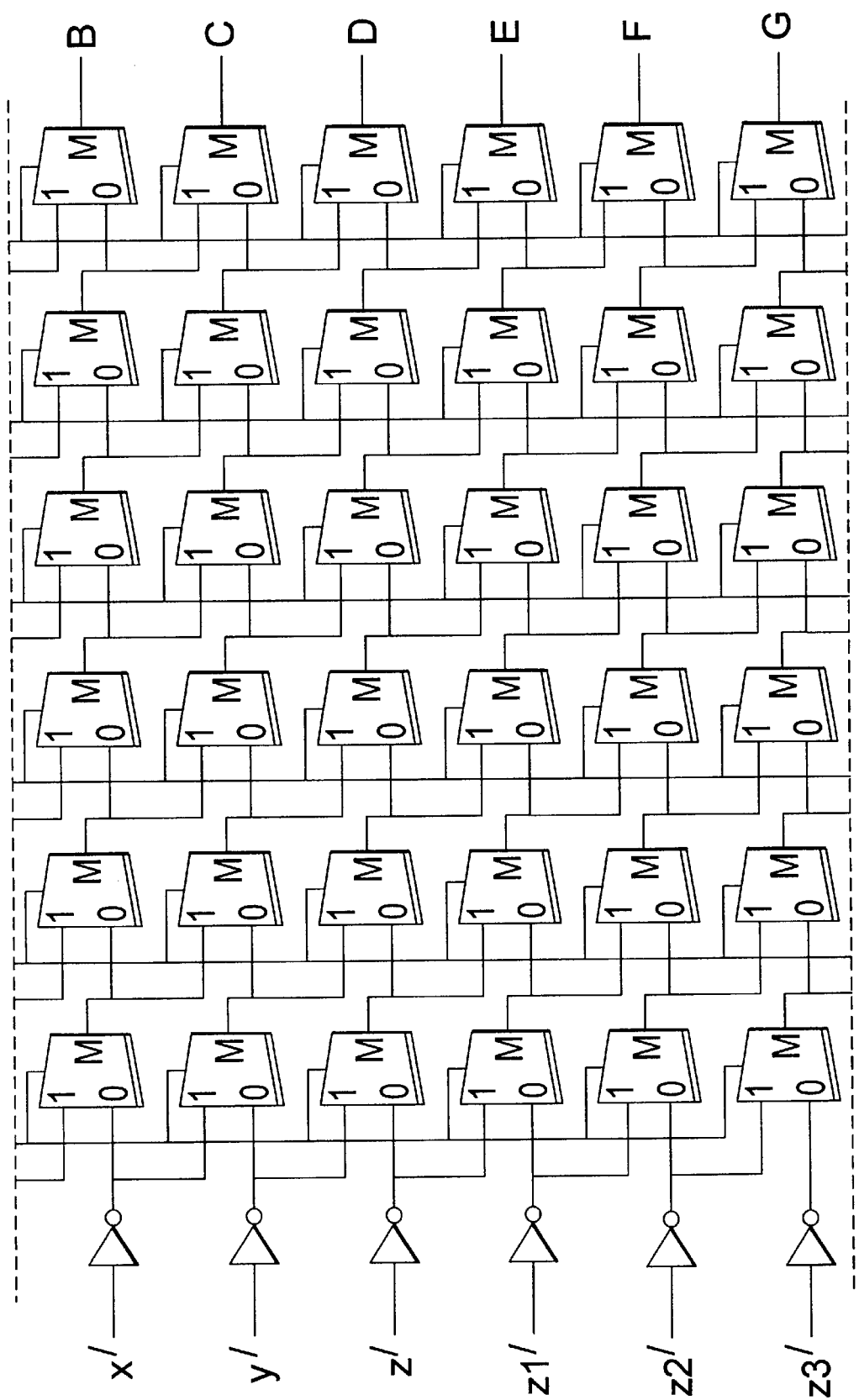
Figure 6C:
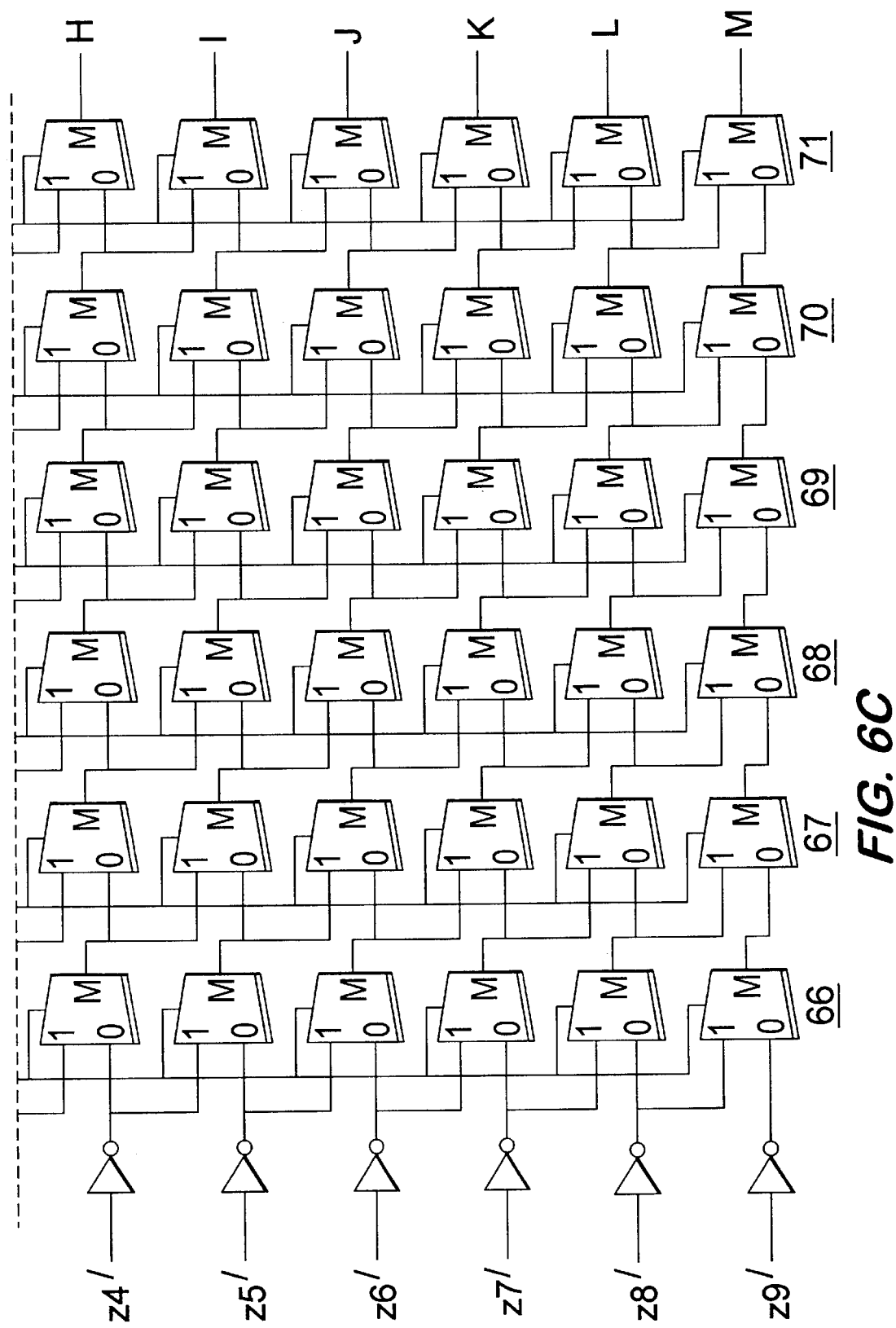

The anti-log circuit of FIG. 6 operates in the opposite manner to the LOG circuit of FIG. 5 as shown in Table 2 of FIG. 9. The anti-log circuit comprises shifters 66 to 71 comprising multiplexers identical to those of the shifters 56 to 61. The multiplexers shift towards the least significant Bit (LSB) in response to a shift control signal of logic 1. The MSB multiplexers receive logic zero on their 1-inputs. The shift control circuit 72 of the anti-logger is simplified and has shift control outputs labelled P' to U' and inputs u', v', w' corresponding to outputs u, v, w of the log circuit. The control 72 implements the truth table of Table 3 (shown in FIG. 9, which is the same as the shift control table of the log circuit in Table 1.

Figure 7:
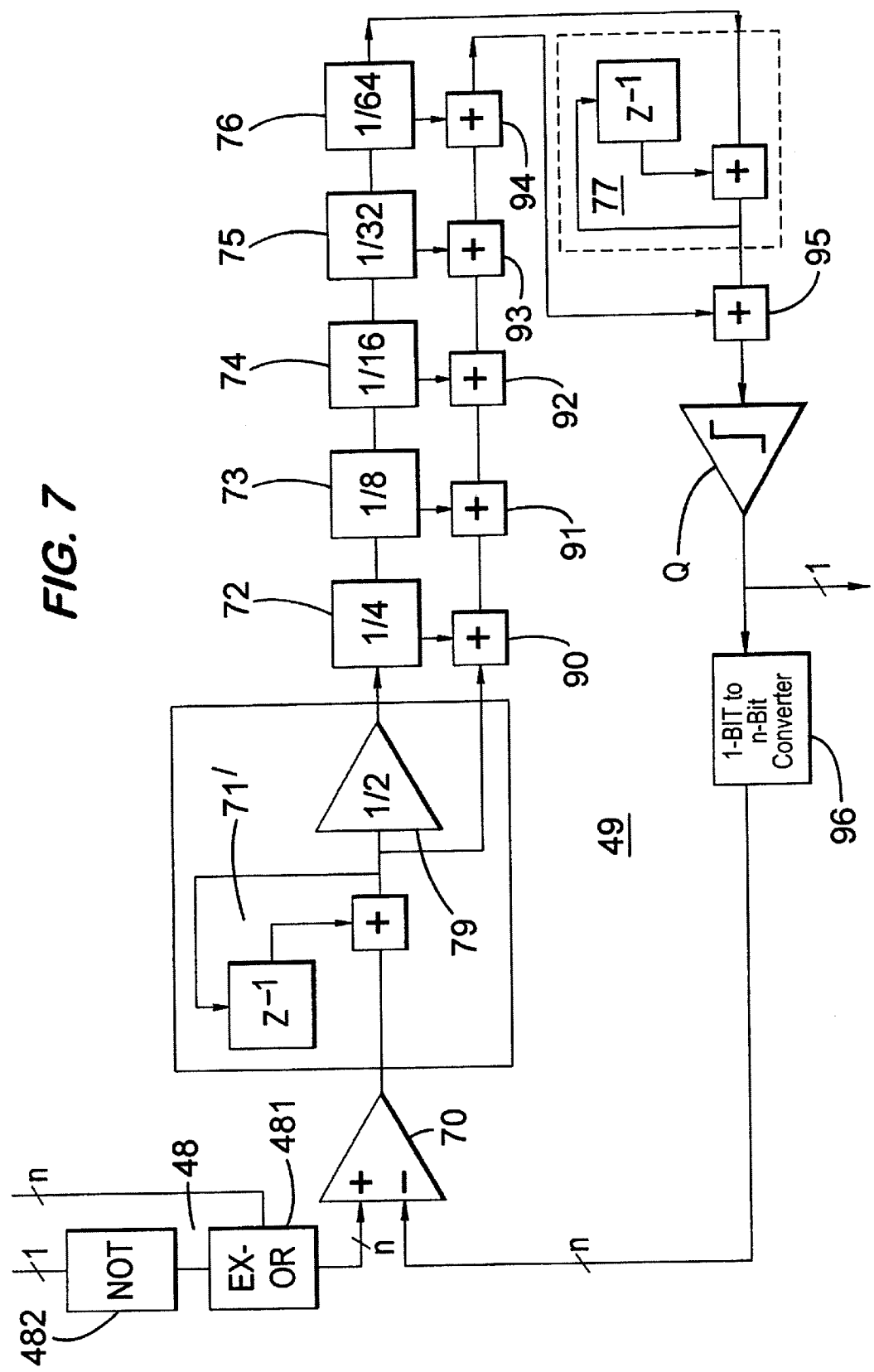
FIG. 7 is a block diagram of a Delta Sigma Modulator of FIG. 4 for requantising the p-bit signal as a 1-bit signal.

Referring to FIG. 7, an example of the Delta Sigma Modulator (DSM) 49 and the 1-bit multiplier 48 is shown. The 1-bit multiplier may be a set of n EXCLUSIVE-OR gates, one for each bit of the n-bit signal, each gate having an input coupled to the 1-bit signal via an inverter 482. FIG. 7 shows only one such gate 481.

The DSM operates in the digital domain in generally similar fashion to the ADC shown in FIG. 1. The DSM comprises a quantizer Q which converts the n-bit signal to 1-bit form. The quantizer may be a comparator having a threshold of zero. The 1-bit output signal from the quantizer Q is fedback via a 1-bit to n-bit converter 96 to a subtracter 70 to form the difference between an n-bit version of the 1-bit output signal and the n-bit input signal. The DSM is clocked by unshown clocking arrangements known in the art at 2.8224 MHz, i.e. at the same sampling rate as the original input 1-bit signal and the n-bit signal.

The other elements of the DSM form a noise shaping filter. These elements comprise a series of integrators and coefficient multipliers 71 to 76 and an integrator 77. The outputs of the integrators and multipliers 71 to 76 and 77 are summed in adders 90 to 95 for application to the quantizer Q to produce the 1-bit output signal. Only one (71) of the integrator/multipliers is shown in detail. It comprises an integrator 71' formed by a 1-sample period delay 71' and an adder, followed by a coefficient multiplier 79. The input of the multiplier is tapped-off to an adder 90. The elements 72 to 76 are identical to element 71 except that the coefficients applied by the multipliers of elements 71 to 76 are 1/2, 1/4, 1/8, 1/16, 1/32, 1/64 respectively. Element 77 is an integrator without a multiplier.

Figure 8A:
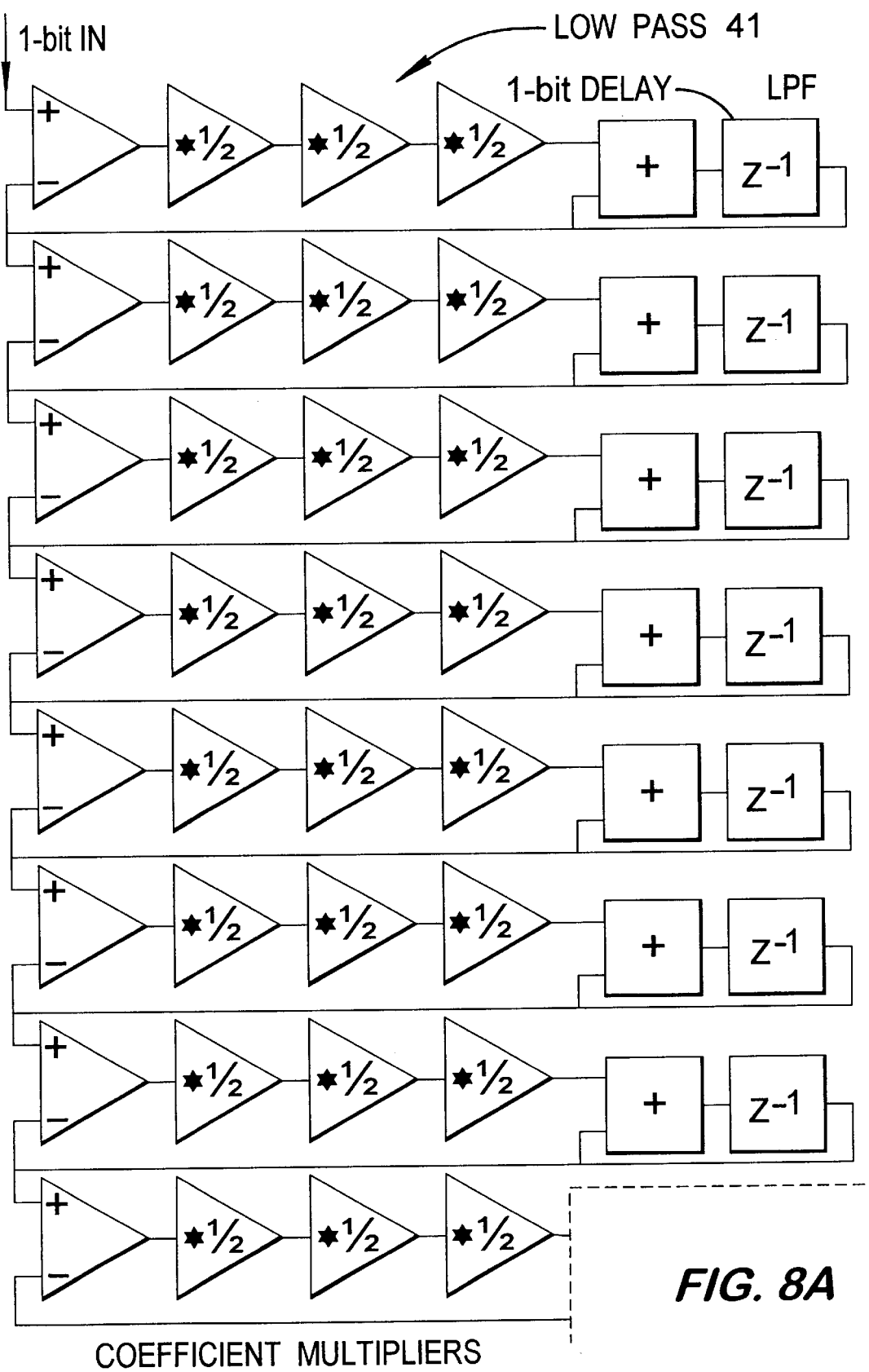
FIG. 8 is a diagram of a low pass filter, absolute value circuit and high pass filter useful in the circuit of FIG. 4.
Figure 8B:
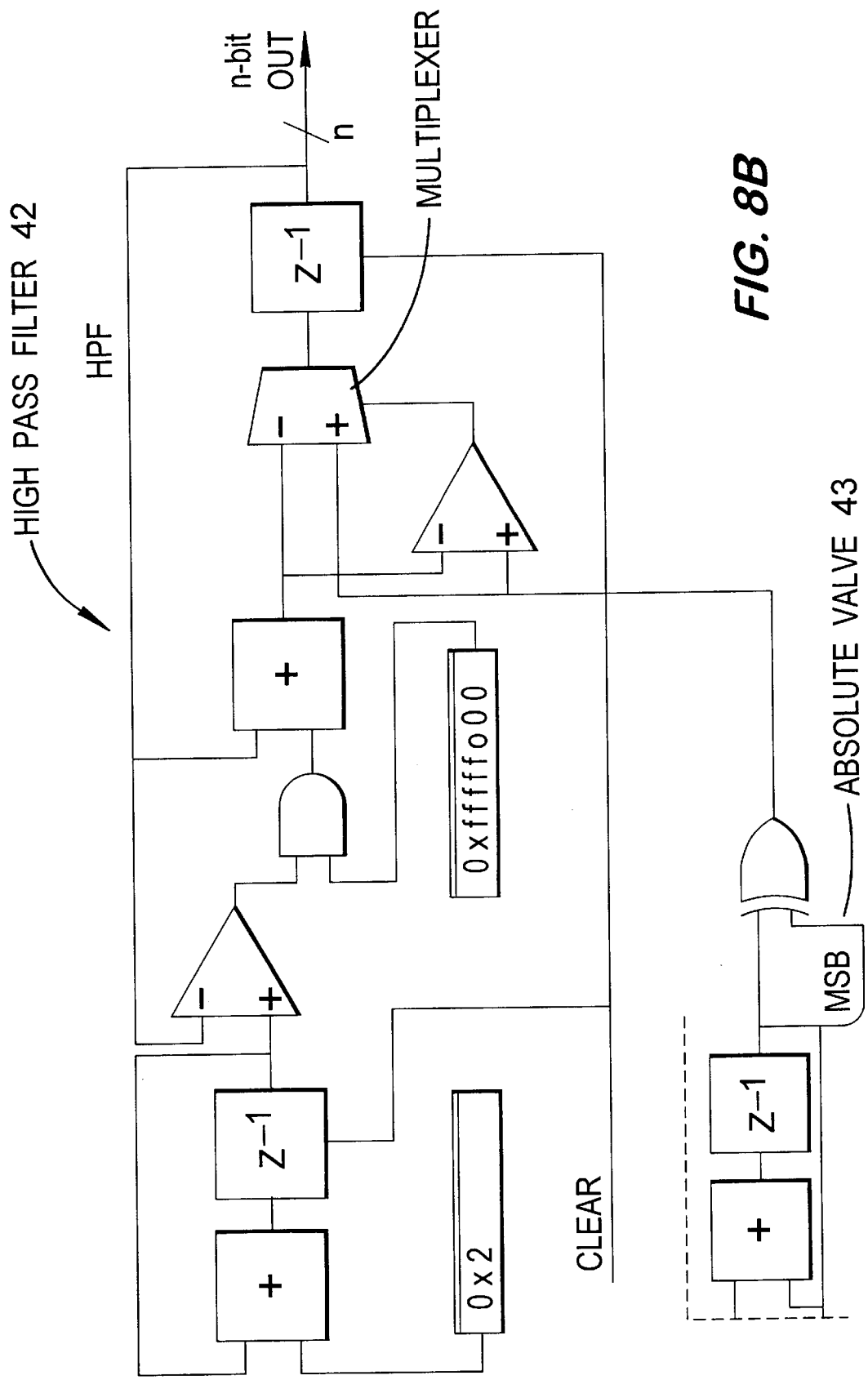

FIG. 8, for completeness shows examples of the low pass filter 41, high pass filter 42 and absolute value circuit 43 of FIG. 4. If the absolute value circuit of FIG. 8 is used, then the absolute value circuit of FIG. 5A is unnecessary. The clocking arrangements are not shown in FIG. 8. The 1-bit input signal has a sampling rate of 64×44.1 MHz: the n-bit output signal has the same sampling rate.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. An audio signal processor for processing 1-bit signals, comprising:
   an input for receiving a 1-bit signal,
   means for low pass filtering the 1-bit signal whereby the signal is also converted to an n-bit signal where n is greater than one,
   means for determining the absolute value of the n-bit signal,
   means for producing an n-bit dynamics control signal dependent on the absolute value,
   means for applying the n-bit dynamics control signal to the 1-bit input signal by using said 1-bit input signal to negate or pass said n-bit dynamics control signal derived from said 1-bit signal, and
   means for requantizing the dynamics controlled signal as a 1-bit signal and shaping the noise in the requantised 1-bit signal.

2. A processor according to claim 1, further comprising means for high pass filtering the 1-bit and/or n-bit signal to remove low frequency noise.

3. A processor according to claim 1, further comprising means for subtracting a selectable threshold value from the n-bit signal.

4. A processor according to claim 1, wherein the means for producing the dynamics control signal comprises a multiplier for multiplying the n-bit signal with a ratio signal dependent on a desired compression or expansion.

5. A processor according to claim 1, wherein the sampling rate of the n-bit signal equals the sampling rate of the 1-bit signal received at said input.

6. A processor according to claim 1, further comprising a log circuit for converting n-bit signal values to log base 2 and an anti-log circuit for converting the log base 2 values to non-logarithmic values, and wherein at least the means for producing the dynamics control signal operates on log base 2 values.

7. A processor according to claim 6, wherein the applying means operates on non-logarithmic values.

8. A processor according to claim 1, wherein the requantising and noise-shaping means comprises a Delta Sigma Modulator.

* * * * *